(12) United States Patent
Okamoto

(10) Patent No.: US 6,383,891 B1
(45) Date of Patent: May 7, 2002

(54) METHOD FOR FORMING BUMP AND SEMICONDUCTOR DEVICE

(75) Inventor: Akira Okamoto, Saitama (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 09/284,616
(22) PCT Filed: Oct. 29, 1997
(86) PCT No.: PCT/JP97/03925
 § 371 Date: Jun. 24, 1999
 § 102(e) Date: Jun. 24, 1999
(87) PCT Pub. No.: WO98/20541
 PCT Pub. Date: May 14, 1998

(30) Foreign Application Priority Data

Nov. 6, 1996 (JP) ............................................. 8-310060

(51) Int. Cl.[7] ............................................. H01L 21/30
(52) U.S. Cl. ............................................. 438/455
(58) Field of Search .................. 438/455, 456–459, 438/14–18, 584, 612, 613, 617

(56) References Cited

FOREIGN PATENT DOCUMENTS

| JP | 6-188290 | 7/1984 |
| JP | 3-74852 | 3/1991 |
| JP | 3-230533 | 10/1991 |
| JP | 8-203909 | 8/1996 |

OTHER PUBLICATIONS

Patent Abstracts of Japan, vol., 014, No. 414 (E–0975) Sep. 7, 1990, JP–A–02 159094 (Abstract) Jun. 19, 1990.

Patent Abstracts of Japan, vol., 1995, No. 11, Dec. 26, 1995, JP–A–07 201869 (Abstract) Aug. 4, 1995.

*Primary Examiner*—Charles Bowers
*Assistant Examiner*—Craig Thompson
(74) *Attorney, Agent, or Firm*—Dellett and Walters

(57) ABSTRACT

The present invention intends to form bumps of desired size and shape by simple steps. For this end, pads 2 are formed on a printed circuit board 1 at the same space as pads on a semiconductor chip 5. Then, the entire upper surface of the printed circuit board 1 is covered with a resist 3 except pad formed areas. The surface of the printed circuit board 1 covered with the resist 3 is then oriented downwardly and is sprayed with molten solder from the bottom side. The molten solder attaches the pad formed surface on the printed circuit board 1 and ideal semispherical bumps 4 are formed by the influence of gravity. The printed circuit board 1 formed with the bumps 4 is aligned with the pads 6 on the semiconductor chip 5 to be transferred into a high temperature oven. The bumps 4 are molten for jointing the semiconductor chip 5 and the printed circuit board 1.

17 Claims, 3 Drawing Sheets

METHOD FOR FORMING BUMP AND SEMICONDUCTOR DEVICE

FIELD OF INVENTION

The present invention relates to a method of making bumps for use in connecting 2 substrates (for example a printed circuit board and a semiconductor chip) having pads formed thereon in a case of mounting by BGA (ball grid array) or flip chip technique and a semiconductor device made by using the bumps.

BACKGROUND OF THE INVENTION

One of the technologies for mounting semiconductor chips on a printed circuit board is a BGA (ball grid array) technology in which pads are formed on both of the semiconductor chips and the printed circuit board to be jointed together by way of solder or gold balls. The use of such bumps enables to mount the semiconductor chips on the printed circuit board in higher density than conventional mounting by the use of semiconductor chips having pin-type terminals or by a COB (chip on board) mounting using bonding wires.

On the other hand, the flip chip mounting for directly mounting bare semiconductor chips on a printed circuit board without packaging is gaining popularity in recent years. In the flip chip mounting, pads on the bare chip are also jointed to pads on a printed circuit board by way of bumps.

Known methods of forming bumps for the BGA mounting or the flip chip mounting are a normal bump, a decalcomania transferring bump, ball bump and mesa bump. The normal bump is formed by covering with resist the upper surface of a semiconductor wafer where bumps are not formed and then forming bumps by plating before removing the resist. The decalcomania transferring process is decalcomania transferring bumps at ends of inner leads and the bumps and aluminium electrodes of a semiconductor chip are aligned before being heated and compressed. The ball bump process is to use a wire bonding machine to attach a bump on each pad. Finally, the mesa bump process is integrally forming bumps on ends of inner leads.

Among these 4 bump forming processes, the decalcomania transferring and mesa bump processes require inner leads which are not suitable for BGA or flip chip mounting. Also, the ball bump process requires to attach bumps on the pads sequentially. This process is time consuming if the number of bumps increases. On the other hand, bumps are formed by plating process in the normal bump process and tend to vary in size and shape.

SUMMARY OF THE INVENTION

In light of the above disadvantages of conventional bump forming processes, the object of the present invention is to provide a method of forming bumps of desired size and shape without requiring complex steps and also to provide a semiconductor device using such bumps.

The method of forming bumps in the present invention comprises the steps of covering the upper surface of a first substrate with a resist except pad formed areas, spraying electrically conductive material on the surface covered with the resist of the first substrate that is oriented downwardly, and forming semispherical bumps at the bump forming areas. By orienting the pad formed areas downwardly and spraying electrically conductive material upwardly onto the pad formed areas, gravity helps to form semispherical bumps at the pad formed areas, thereby avoiding complex steps for forming the bumps.

Also, the method of forming bumps according to the present invention comprises the steps of forming printed pattern of desired thickness by screen printing about pads on a first substrate, and forming substantially semispherical bumps by utilizing surface tension to deform the printed pattern. After forming printed pattern by screen printing about the pads on the first substrate, the printed pattern deforms spherically by surface tension, thereby forming semispherical bumps without need for any special machines, etc.

Another method of forming bumps according to the present invention comprises the steps of screen printing on the upper surface of a first substrate to form a printed pattern of a desired thickness about pads on the first substrate, and keeping the first substrate with the surface having the printed pattern facing downwardly for a sufficient time to form the printed pattern in a semispherical shape. Since the printed pattern is formed about the pads on the first substrate by screen printing and the surface having the printed pattern thereon is faced downwardly for a predetermined time, gravity helps to form spherical bumps very easily.

BRIEF DESCRIPTION OF DRAWINGS

Now, the present invention will be described in detail by reference to the accompanying drawings, wherein.

DESCRIPTION OF PREFERRED EMBODIMENTS (First embodiment)

FIGS. 1(a)–1(e) illustrate the method of forming bumps and steps of fabricating the semiconductor device according to the present invention. FIGS. 1(a)–1(e) show an example of mounting packaged semiconductor chip on a printed circuit board by the BGA technology. More specifically, it is to joint pads on a package of a semiconductor device and pads on a printed circuit board by way of bumps. The above mentioned printed circuit board and the packaged semiconductor chip correspond to a first and a second substrates, respectively.

Figure 1:
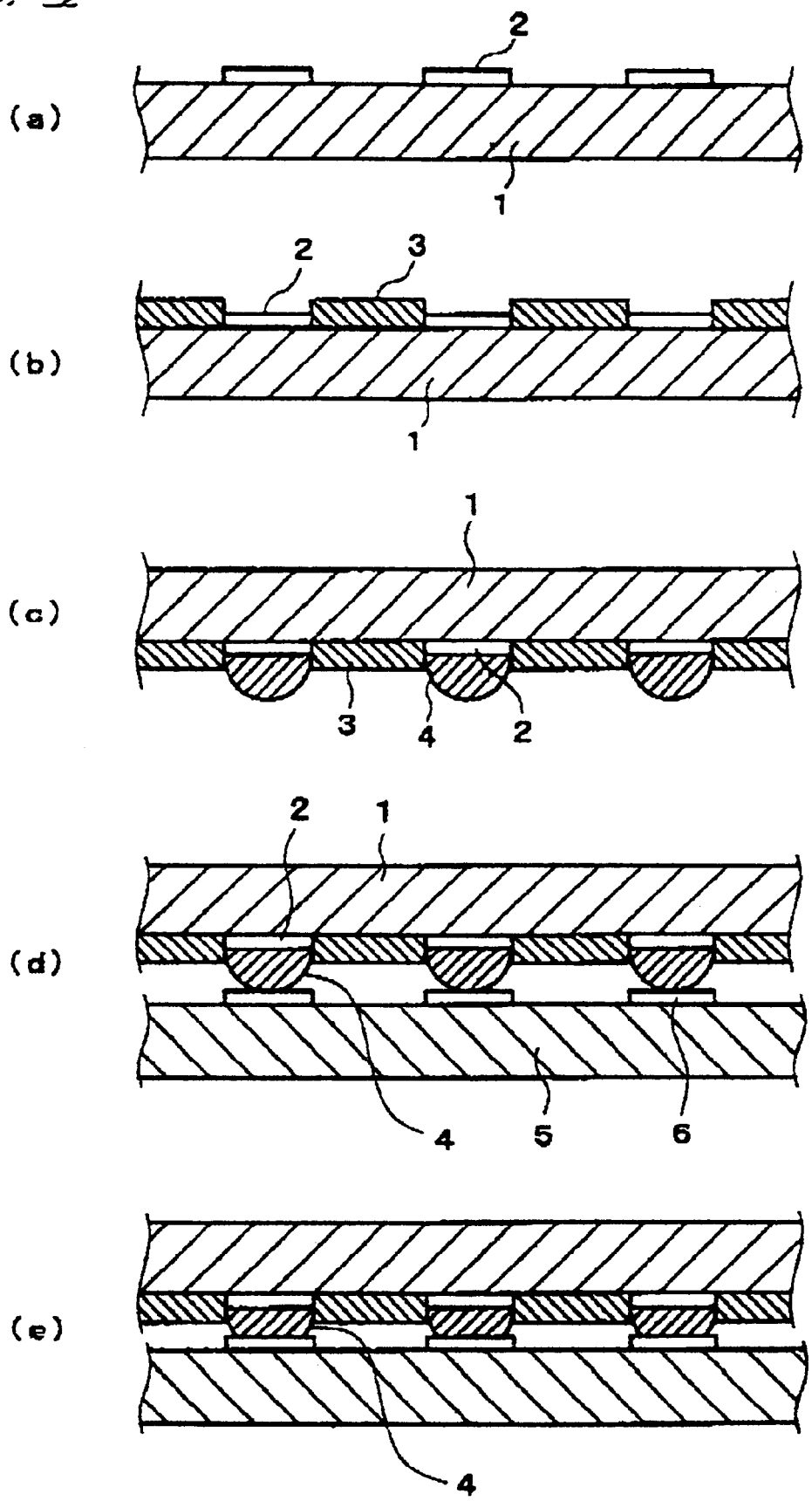
FIGS. 1(a)–1(e) illustrate steps of forming the bumps and steps of fabricating a semiconductor device according to the present invention.

Now, as illustrated in FIG. 1(a), pads 2 are formed on a printed circuit board 1 at the same spacing as pads on a semiconductor chip. Then, as shown in FIG. 1(b), the upper surface of the printed circuit board 1 is covered with a resist 3 over the entire area except pad forming areas. Subsequently, the printed circuit board 1 is oriented so that the surface covered by the resist 3 faces downwardly and molten solder is sprayed upwardly onto the printed circuit board 1 to form bumps 4 at the pad forming areas as shown in FIG. 1(c).

Figure 2:
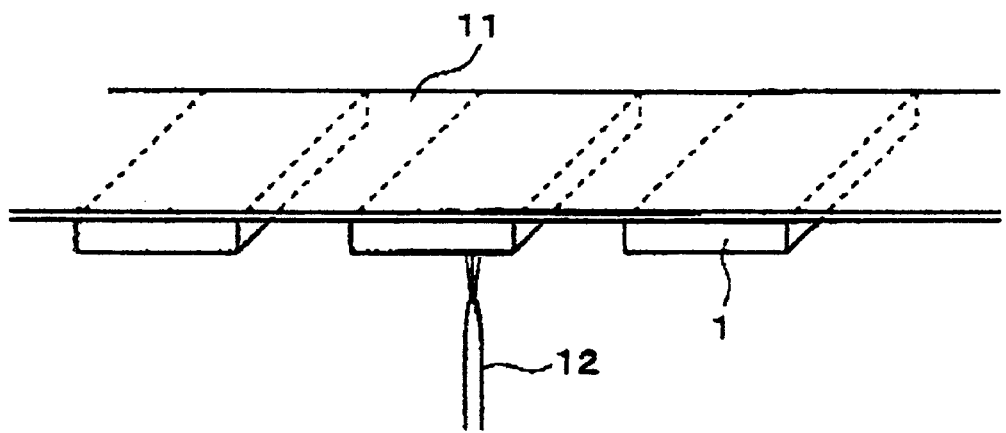
FIG. 2 is a detailed illustration of the step in FIG. 1(c)

FIG. 2 is a detailed illustration of the step in FIG. 1(c). As shown in FIG. 2, the printed circuit board 1 is placed on the bottom of a conveyor 11 with the pad formed surface of the printed circuit board 1 facing downwardly. Disposed below the conveyor 11 is a nozzle 12 for spraying molten solder. When the conveyor 11 starts to move, the molten solder is sprayed onto the printed circuit board 1 passing above the nozzle 12. The solder will not attach the areas on the printed circuit board 1 covered with the resist 3 but will attach onto the pad formed areas to form a solder layer. Gravity will exert on the solder layer to make it in a semispherical shape, thereby forming each bump 4. Since a constant amount of solder is supplied from the nozzle 12, bumps 4 of substantially constant size will be formed.

After removing the resist 3 from the printed circuit board 1 having the bumps 4 formed thereon, it travels through a high temperature oven after alignment with pads 6 on a semiconductor chip 5 as shown in FIG. 1(d). As a result, the bumps 4 will be molten to joint the semiconductor chip 5 to the printed circuit board 1 by way of the bumps 4 as shown in FIG. 1(e).

As apparent from the above description, since the solder layer is formed at the pad formed areas by spraying the molten solder onto the pad formed surface of the printed circuit board 1 facing downwardly, gravity exerts on the solder layer to form the ideal semispherical bumps 4 by simple steps and without using special machines, etc.

Also, since all areas of the printed circuit board 1 except the bump forming areas are covered with the resist 3, no solder will attach to any undesired area. Advantageously, a constant amount of the molten solder is sprayed from the nozzle 12 onto the printed circuit board 1 while it is moving at a constant speed, thereby minimizing any change in size and shape of the bumps 4. Also, manufacturing efficiency is improved by placing a plurality of the printed circuit boards 1 on the conveyor 11 at a constant space to form uniform bumps 4 on the printed circuit boards 1 in a short time.

Figure 3:
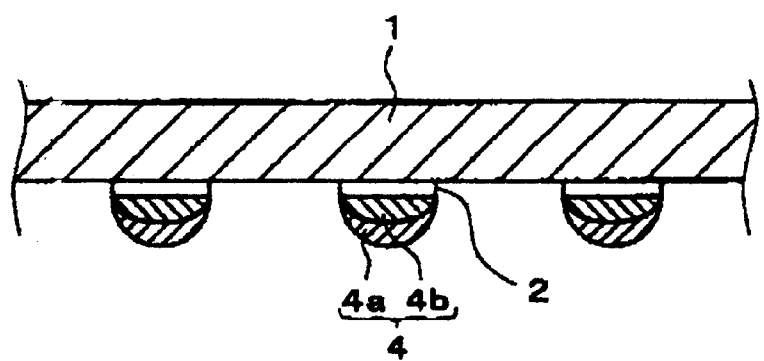
FIG. 3 is an example of a 2 layered bump.

It is to be noted, however, that the material to be sprayed from the nozzle 12 should not be limited to the above mentioned molten solder but could be various other materials (such as gold) that are adhesive and electrically conductive. It is also possible to spray 2 or more different materials to form the above mentioned bumps 4. Shown in FIG. 3 is an example of a 2-layer-structure of the bumps 4 comprising an upper low melting point solder layer 4a and a lower high melting point solder layer 4b. Such construction is effective to improve adhesiveness of the bumps 4 as compared with conventional single layer bumps 4 because electrical contact with the semiconductor chip 5 is established at the time when the upper solder layer 4a is molten. In case of multi-layer construction of the bumps 4, different materials may be sprayed from a single nozzle 12 or 2 or more nozzles 12 may be used. In case of wider area of the printed circuit board 1, a plurality of nozzles 12 may be placed in a line for simultaneously spraying equal amount of molten solder from each nozzle 12.

(Second Embodiment)

A second embodiment of the present invention to be described hereunder is to form the bumps by screen printing.

Figure 4:
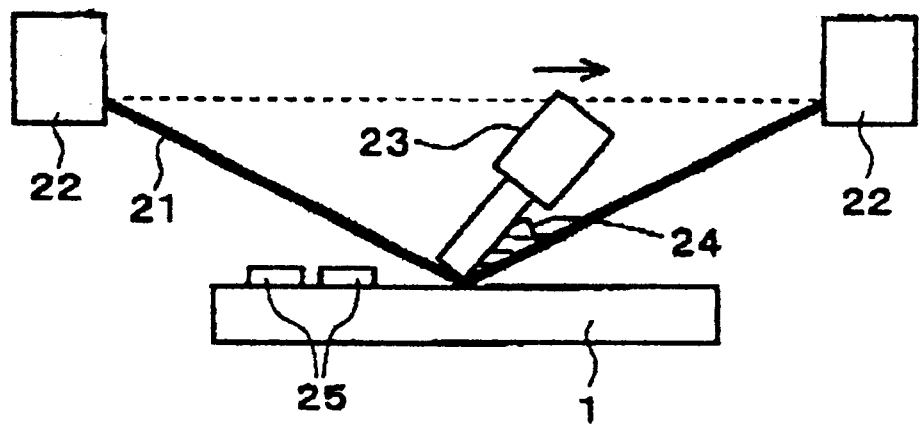
FIG. 4 illustrates the screen printing.

FIG. 4 is a simplified illustration of screen printing. Disposed above the printed circuit board 1 is a screen mask 21 having a print of the pattern of the bumps 4. The screen mask 21 is supported by a screen frame 22 at both ends and is brought into close contact on the upper surface of the printed circuit board 1 when pressed by a squeeze 23 and returns to an initial position as shown by the dotted line when the squeeze 23 is removed.

The squeeze 23 is pressed on the upper surface of the screen mask 21 while placing electrically conductive paste 24 containing solder, gold, etc. on the screen mask 21 and is moved in the direction as shown by the arrow in FIG. 4. The screen mask 21 is in contact with the printed circuit board 1 only at the portion where the squeeze 23 contacts and is separated from the printed circuit board 1 when the squeeze 23 passes. In this manner, there remains on the printed circuit board 1 a printed pattern 25 corresponding to the pattern on the screen mask 21.

As soon as completing the screen printing, the printed pattern 25 is kept in a downward orientation for a predetermined time, thereby exerting gravity on the wet screen printing to complete semispherical bumps 4 when solidified.

Subsequently, the same steps as in FIGS. 1(d) and (e) are carried out for mounting the semiconductor chip 5 on the printed circuit board 1.

Since the bumps 4 are formed by screen printing in the second embodiment, any change in size of the bumps 4 can be minimized. Unlike the first embodiment, the second embodiment can eliminate the need for forming the pads and resist on the printed circuit board 1, thereby further simplifying the manufacturing steps.

Figure 5:
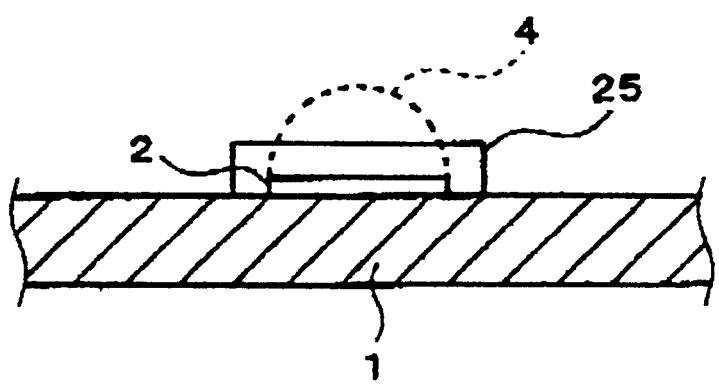
FIG. 5 shows the shape of the printed pattern.

It is to he noted that if the printed pattern 25 is formed wider and thicker than the bumps 4 as shown in FIG. 5, the printed pattern 25 may have substantially the same area as the bumps 4 even if the printed pattern 25 may shrink by surface tension. Since the printed pattern 25 can be deformed in a semispherical shape as shown in FIG. 5 by utilizing surface tension, there is no need to face the printed surface downwardly, thereby simplifying the manufacturing steps. Alternatively, the bumps 4 may be formed by utilizing both surface tension and gravity.

In the first and second embodiments as described hereinbefore, the bumps 4 are formed on the printed circuit board 1. However, it is to be noted that the bumps 4 may be formed on the semiconductor chip 5.

Although the above first and second embodiments are described about the method of forming bumps for mounting by the BGA technology, these embodiments can be applied for making bumps 4 for flip chip mounting wherein bare chips scribed from a semiconductor wafer are to be mounted on the printed circuit board 1. However, since flip chip mounting requires bumps 4 smaller size than those for the BGA mounting, it is necessary to modify the amount of material sprayed from the nozzle 12 and change the pattern shape of the screen mask 21.

The material for the pads to be formed on bare chips is generally aluminum, polysilicon, etc. However, since these materials are not easily solderable, it is necessary to have an intermediate metal layer on the surface prior to spraying the molten solder. The intermediate metal layer is prepared in consideration of adhesiveness, mutual diffusion, and solderability. A preferable intermediate metal layer is, for example, a copper or gold layer formed by plating or vapor deposition technique. Alternatively, it may be Cr—Cu—Au, TiW—Cu, Ti—Cu—Ni, Al/Ni—Ni—Cu, etc. Such surface layer is also effective for forming bumps 4 on a printed circuit board and the like formed with pads that are not easily solderable.

In case of flip chip mounting, bumps 4 are formed on a semiconductor wafer prior to scribing and the semiconductor wafer may be scribed into discrete chips after forming the bumps.

INDUSTRIAL APPLICABILITY

As described above, according to the present invention, the bumps are formed on a first substrate by spraying electrically conductive material upwardly onto the surface covered with a resist. Gravity is utilized for forming ideal semispherical bumps. By spraying the electrically conductive material while moving the first substrate by a conveyor, the electrically conductive material can be sprayed uniformly on the first substrate, thereby minimizing any variation in size and shape of the bumps.

Also, by spraying 2 or more electrically conductive materials, it is possible to form multilayer bumps very easily.

It is therefore easy to form bumps comprising an upper layer of relatively lower melting point than a lower layer, thereby improving solderability.

What is claimed is:

1. A method of forming bumps for interconnecting pads formed on both of first and second substrates, comprising the steps of:

covering with a resist the entire upper surface of the first substrate except pad formed areas; and spraying electrically conductive material of controlled amount upwardly onto the surface covered with the resist facing downwardly to form substantially semispherical bumps of desired size at the pad formed areas at the first substrate.

2. A method of forming bumps of claim 1, wherein the electrically conductive material is sprayed while the first substrate is being conveyed.

3. A method of forming bumps of claim 1, wherein the amount of spraying the electrically conductive material is adjusted to form the bumps of a desired size.

4. A method of forming bumps of claim 1, wherein 2 or more electrically conductive materials are sprayed to form the bumps in multi-layer construction.

5. A method of forming bumps of claim 4, wherein the bumps are formed with 2 or more electrically conductive materials with the upper layer melting at a lower temperature than the lower layer.

6. A method of forming bumps of claim 1, wherein either one of the first and second substrates is a printed circuit board while the other is a semiconductor chip.

7. A method of forming bumps of claim 6, wherein the semiconductor chip is a bare chip scribed from a semiconductor wafer and the bumps are formed for mounting the bare chip on the printed circuit board by flip chip mounting.

8. A method of forming bumps of claim 7, wherein the bumps are formed over the entire surface of the semiconductor wafer before being scribed.

9. A method of forming bumps for interconnecting pads formed on both of first and second substrates, comprising the steps of:

forming a printed pattern of desired thickness by screen printing on areas including the pad formed areas but wider than the pad formed areas; and forming substantially semispherical bumps by utilizing at least surface tension to deform the printed pattern.

10. A method of forming bumps of claim 9, wherein the first substrate is kept for a predetermined time with the surface of the printed pattern facing downwardly for deforming the printed pattern in substantially semispherical shape.

11. A method of forming bumps of claim 9, wherein either one of the first and second substrates is a printed circuit board while the other substrate is a semiconductor chip.

12. A method of forming bumps of claim 11, wherein the semiconductor chip is a bare chip scribed from a semiconductor wafer for forming the bumps for mounting the bare chip on the printed circuit board by flip chip mounting.

13. A method of forming bumps of claim 12, wherein the bumps are formed over the entire surface of the semiconductor wafer before being scribed.

14. A method of forming bumps for interconnecting pads formed on both of first and second substrates, comprising the steps of:

screen printing on the upper surface of the first substrate a printed pattern of desired thickness at peripheries of the pads on the first substrate; and keeping the first substrate with the surface of the printed pattern facing downwardly for a sufficient time to deform the printed pattern in substantially semispherical shape.

15. A method of forming bumps of claim 14, wherein either one of the first and second substrates is a printed circuit board while the other substrate is a semiconductor chip.

16. A method of forming bumps of claim 15, wherein the semiconductor chip is a bare chip scribed from a semiconductor wafer and the bumps are used for mounting the bare chip on the printed circuit board by flip chip mounting.

17. A method of forming bumps of claim 16, wherein the bumps are formed over the entire surface of the semiconductor wafer before being scribed.

* * * * *